(12) United States Patent
Farkas et al.

(10) Patent No.: US 11,602,043 B2
(45) Date of Patent: Mar. 7, 2023

(54) SYSTEMS AND METHODS FOR VARYING AN IMPEDANCE OF A CABLE

(71) Applicant: Dell Products L.P., Round Rock, TX (US)

(72) Inventors: Sandor Farkas, Round Rock, TX (US); Bhyrav Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/354,131

(22) Filed: Jun. 22, 2021

(65) Prior Publication Data

US 2022/0408546 A1 Dec. 22, 2022

(51) Int. Cl.
| | |
|---|---|
| H05K 1/02 | (2006.01) |
| H05K 1/18 | (2006.01) |
| H05K 1/11 | (2006.01) |
| H01R 12/53 | (2011.01) |
| H01R 43/00 | (2006.01) |
| H01R 43/02 | (2006.01) |

(52) U.S. Cl.
CPC ............. *H05K 1/025* (2013.01); *H01R 12/53* (2013.01); *H05K 1/11* (2013.01); *H05K 1/18* (2013.01); *H01R 43/00* (2013.01); *H01R 43/0249* (2013.01); *H05K 2201/09036* (2013.01); *H05K 2201/10356* (2013.01)

(58) Field of Classification Search
CPC ............. H05K 1/025; H05K 1/11; H05K 1/18
See application file for complete search history.

(56) References Cited

U.S. PATENT DOCUMENTS

| | | | |
|---|---|---|---|
| 6,007,347 A  * | 12/1999 | Keldsen | H05K 1/0219 439/63 |
| 6,927,655 B2 * | 8/2005 | Torigoe | H01L 23/66 333/260 |

* cited by examiner

*Primary Examiner* — Jeremy C Norris
(74) *Attorney, Agent, or Firm* — Jackson Walker L.L.P.

(57) ABSTRACT

A system may include a circuit board comprising a plurality of electrically-conductive layers separated and supported by layers of insulating material laminated together, wherein the plurality of electrically-conductive layers comprises a ground plane and the layers of insulating material comprise a surface layer having one or more openings through which the ground plane is exposed through the one or more openings. The system may also include a plurality of electrically-conductive pads formed on a surface of the surface layer and a cable comprising a first signal conductor mechanically contacted to a first pad of the plurality of electrically-conductive pads and a first drain conductor mechanically contacted to the ground plane through the one or more openings.

7 Claims, 5 Drawing Sheets

SYSTEMS AND METHODS FOR VARYING AN IMPEDANCE OF A CABLE

TECHNICAL FIELD

The present disclosure relates in general to information handling systems, and more particularly to systems and methods for varying an impedance of a cable.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

In many applications, one or multiple information handling servers may be installed within a single chassis, housing, enclosure, or rack. Communication between or within servers and/or between enclosures may often be accomplished via cables, and many communications standards and protocols employ a copper cable implementation for differential signaling. A type of cable known as a dual-axial cable is often used to implement cabling between components. In some embodiments, a differential dual-axial cable coupled to a circuit board in a "hotbar" process is often used as it often eliminates the need for connectors on both the cable and a circuit board to which the cable is coupled, thus reducing impedance discontinuities between the cable and the circuit board as compared to more traditional approaches that employ connectors.

FIGS. 1 and 2 depict different views of a differential cable 70 coupled to a circuit board 50 using a hotbar process, as is known in the art. As shown in FIGS. 1 and 2, differential cable 70 may have a first drain conductor 74, a first signal conductor 76 of a first differential signal wire 78, a second signal conductor 80 of a second differential signal wire 82, and a second drain conductor 84, which, in an ideal case, are all in planar alignment with one another and all run substantially parallel to one another. An outer layer 92 may provide electrical shielding protection to differential cable 70. As shown in FIGS. 1 and 2, first drain conductor 74, first signal conductor 76, second signal conductor 80, and second drain conductor 84 may be respectively contacted to pads 54, 56, 60, and 64 on a surface of circuit board 50. As shown in FIG. 2, a void 55 may be formed in a ground plane 52 of circuit board 50, in order to minimize capacitance between ground plane 52 and each of first signal conductor 76 and second signal conductor 80. Although not shown explicitly in FIG. 2, each of pads 54 and 64 may be electrically coupled to ground plane 52 (e.g., by way of vias traversing between ground plane 52 and each of pads 54 and 64).

FIG. 3 depicts a method for mechanically contacting first drain conductor 74, first signal conductor 76, second signal conductor 80, and second drain conductor 84 to pads 54, 56, 60, and 64, respectively. In practice, a conductive adhesive material (e.g., a small ball of glue, a ball of solder, a solder paste, etc.) in a solid form may be placed on each of pads 54, 56, 60, and 64, and first drain conductor 74, first signal conductor 76, second signal conductor 80, and second drain conductor 84 may be placed in contact with the instances of adhesive material. Then, a hotbar 40, which may comprise a metal or other thermally-conductive material, and which may be heated to a temperature above the melting point of the adhesive material, may apply mechanical pressure between first drain conductor 74, first signal conductor 76, second signal conductor 80, and second drain conductor 84 and pads 54, 56, 60, and 64, respectively, thus melting the adhesive material and causing mechanical contact between first drain conductor 74, first signal conductor 76, second signal conductor 80, and second drain conductor 84 and pads 54, 56, 60, and 64, respectively. Hotbar 40 may then be removed, allowing the adhesive material to cool and return to solid form, and mechanically retaining first drain conductor 74, first signal conductor 76, second signal conductor 80, and second drain conductor 84 to pads 54, 56, 60, and 64, respectively.

A disadvantage of cables coupled to a circuit board via a hotbar process is that hotbar coupling to pads 54, 56, 60, and 64 can lead to a drop in impedance at the cable-to-pad interface, which may be largely due to parasitic capacitance that exists at the cable-to-pad interface between first drain conductor 74 and first signal conductor 76, and between second signal conductor 80 and second drain conductor 84.

SUMMARY

In accordance with the teachings of the present disclosure, the disadvantages and problems associated with traditional approaches to use of cables in an information handling system may be substantially reduced or eliminated.

In accordance with embodiments of the present disclosure, a system may include a circuit board comprising a plurality of electrically-conductive layers separated and supported by layers of insulating material laminated together, wherein the plurality of electrically-conductive layers comprises a ground plane and the layers of insulating material comprise a surface layer having one or more openings through which the ground plane is exposed through the one or more openings. The system may also include a plurality of electrically-conductive pads formed on a surface of the surface layer and a cable comprising a first signal conductor mechanically contacted to a first pad of the plurality of electrically-conductive pads and a first drain conductor mechanically contacted to the ground plane through the one or more openings.

In accordance with these and other embodiments of the present disclosure, a method may include mechanically contacting a first signal conductor of a cable to a first pad of a plurality of electrically-conductive pads formed on a surface of a surface layer of a circuit board comprising a plurality of electrically-conductive layers separated and supported by layers of insulating material laminated together, wherein the plurality of electrically-conductive layers comprises a ground plane and the layers of insulating material comprise a surface layer and mechanically contacting a first drain conductor of the cable to the ground plane through one or more openings formed in the surface layer through which the ground plane is exposed through the one or more openings.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
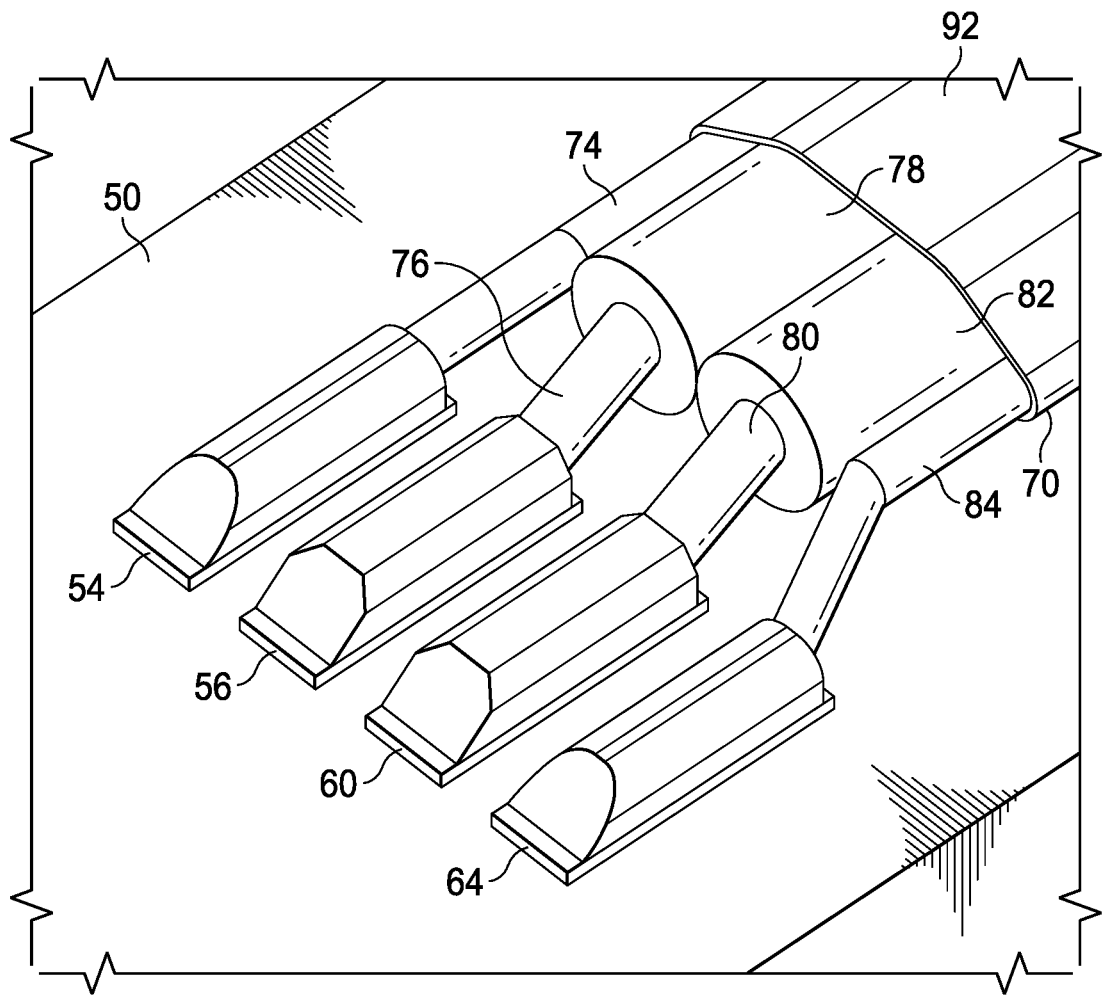
FIG. 1 illustrates an isometric view of a differential cable coupled to a circuit board using a hotbar process, as is known in the art.
Figure 2:
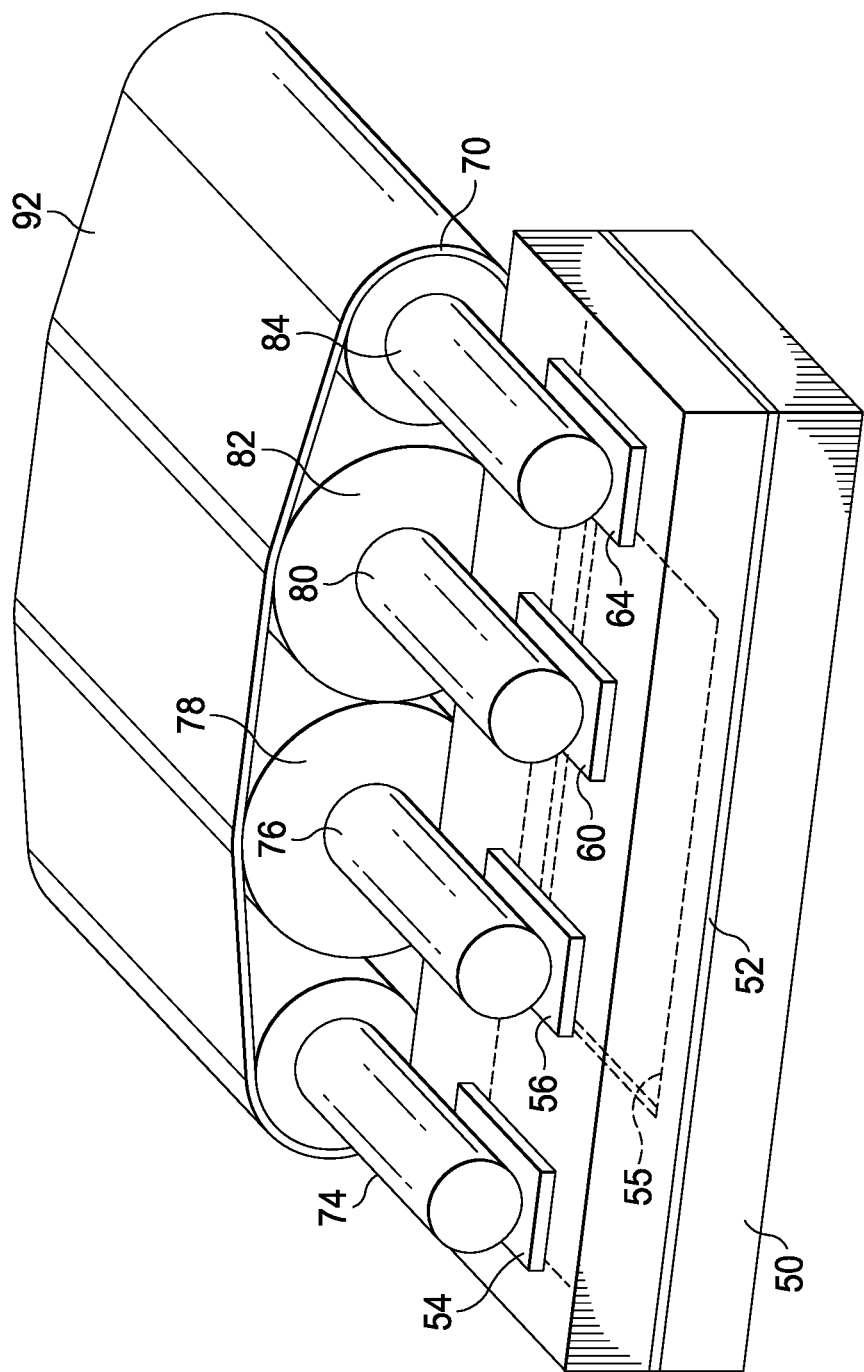
FIG. 2 illustrates another isometric view of a differential cable coupled to a circuit board using a hotbar process and showing detail of some layers of the circuit board, as is known in the art.
Figure 3:
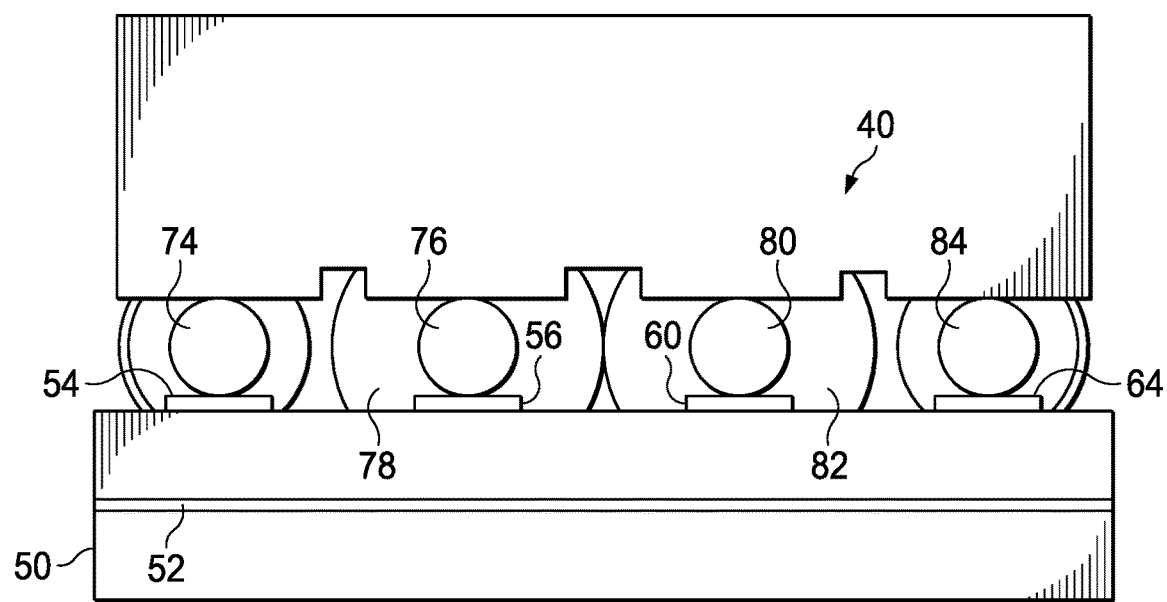
FIG. 3 illustrates a cross-sectional elevation view of a method for mechanically contacting conductors of a differential cable to respective pads of a circuit board using a hotbar process, as is known in the art.
Figure 4:
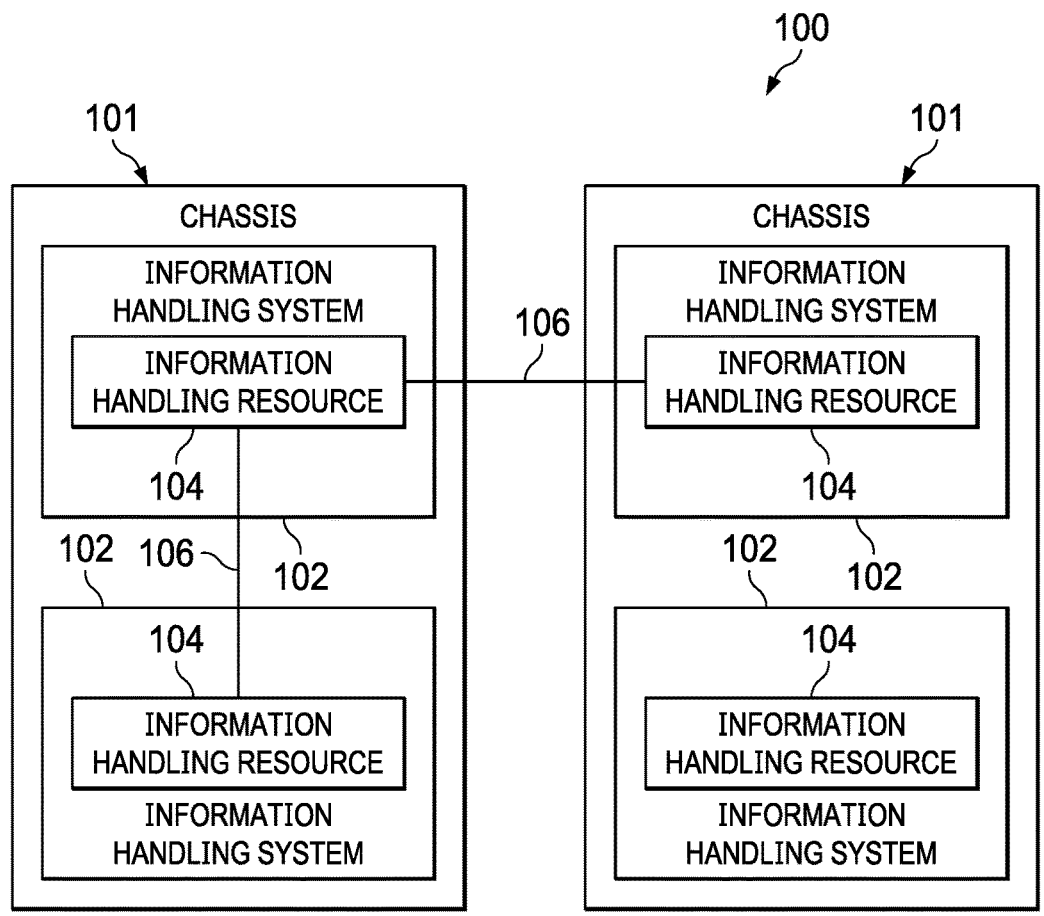
FIG. 4 illustrates a system comprising a plurality of chassis, each chassis comprising at least one information handling system, in accordance with embodiments of the present disclosure.
Figure 5:
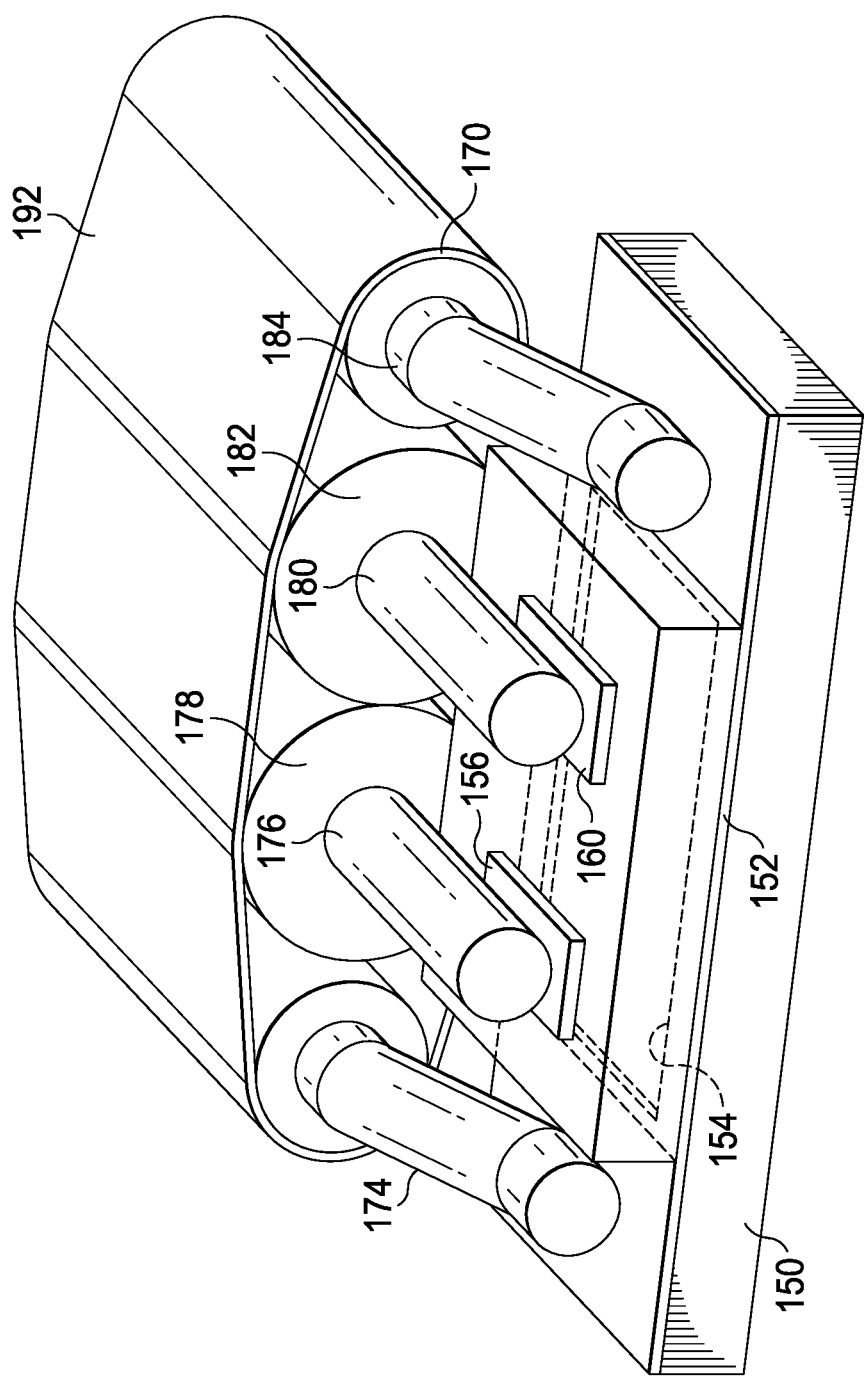
FIG. 5 illustrates an isometric view of a differential cable coupled to a circuit board, in accordance with embodiments of the present disclosure.
Figure 6:
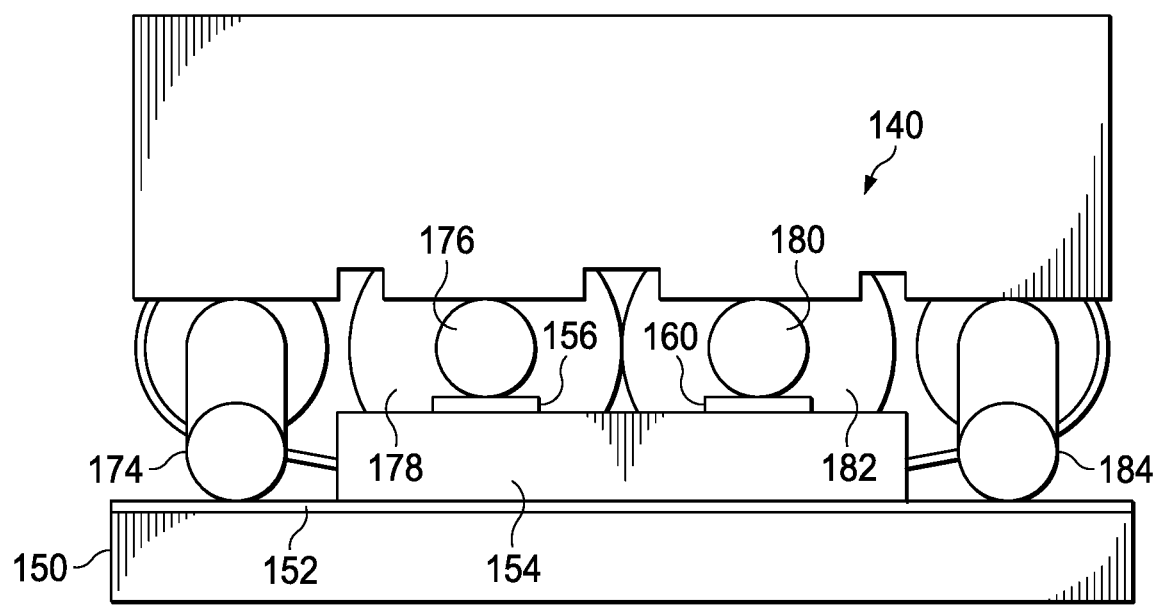
FIG. 6 illustrates a cross-sectional elevation view of a method for mechanically contacting conductors of a differential cable to a circuit board, in accordance with embodiments of the present disclosure.

Preferred embodiments and their advantages are best understood by reference to FIGS. 4 through 6, wherein like numbers are used to indicate like and corresponding parts.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

For the purposes of this disclosure, information handling resources may broadly refer to any component system, device or apparatus of an information handling system, including without limitation processors, service processors, basic input/output systems, buses, memories, I/O devices and/or interfaces, storage resources, network interfaces, motherboards, air movers, sensors, power supplies, and/or any other components and/or elements of an information handling system.

FIG. 4 illustrates a system 100 comprising a plurality of chassis 101, each chassis 101 comprising at least one information handling system 102, in accordance with embodiments of the present disclosure. Each chassis 101 may be an enclosure that serves as a container for various information handling systems 102 and information handling resources 104, and may be constructed from steel, aluminum, plastic, and/or any other suitable material. Although the term "chassis" is used, a chassis 101 may also be referred to as a case, cabinet, tower, box, enclosure, and/or housing. In certain embodiments, a chassis 101 may be configured to hold and/or provide power to one or more information handling systems 102 and/or information handling resources 104.

In some embodiments, one or more of information handling systems 102 may comprise servers. For example, in some embodiments, information handling systems 102 may comprise rack servers and each chassis 101 may comprise a rack configured to house such rack servers. As shown in FIG. 4, each information handling system 102 may include one or more information handling resources 104. An information handling resource 104 may include any component system, device or apparatus of an information handling system 102, including without limitation processors, service processors, basic input/output systems, buses, memories, I/O devices and/or interfaces, storage resources, network interfaces, motherboards, air movers, sensors, power supplies, and/or any other components and/or elements of an information handling system. For example, in some embodiments, an information handling resource 104 of an information handling system 102 may comprise a processor. Such processor may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, a processor may interpret and/or execute program instructions and/or process data stored in a memory and/or another information handling resource of an information handling system 102.

In these and other embodiments, an information handling resource 104 of an information handling system 102 may comprise a memory. Such a memory may be communicatively coupled to an associated processor and may include any system, device, or apparatus configured to retain program instructions and/or data for a period of time (e.g., computer-readable media). A memory may include RAM, EEPROM, a PCMCIA card, flash memory, magnetic storage, opto-magnetic storage, or any suitable selection and/or array of volatile or non-volatile memory that retains data after power to an associated information handling system 102 is turned off.

In addition to a processor and/or a memory, an information handling system 102 may include one or more other information handling resources.

As shown in FIG. 4, information handling resources 104 may be communicatively coupled to each other via a cable 106, whether such information handling resources 104 are within different information handling systems 102 in the same chassis 101, or are in different chassis 101. A cable 106 may include any suitable assembly of two or more electrically-conductive wires running side by side to carry one or more signals between information handling resources. In some embodiments, cable 106 may comprise a differential cable coupled to a circuit board using a hotbar process, as described in greater detail below.

FIG. 5 illustrates an isometric view of a differential cable 170 coupled to a circuit board 150, in accordance with embodiments of the present disclosure. Differential cable 170 as shown in FIG. 5 may be used to implement any or all of cables 106 shown in FIG. 4.

As shown in FIG. 5, differential cable 170 may have a first drain conductor 174, a first signal conductor 176 of a first differential signal wire 178, a second signal conductor 180 of a second differential signal wire 182, and a second drain conductor 184, which, in an ideal case, are all in planar alignment with one another and all run substantially parallel to one another. An outer layer 192 may provide electrical shielding protection to differential cable 170.

Circuit board 150 or a circuit board similar to circuit board 150 may be used to implement at least a portion of each information handling system 102 and/or information handling resources 104. Circuit board 150 may include a plurality of pads, traces, and vias. Pads may comprise a conductive material and may be formed on a surface (e.g., top or bottom surface) of circuit board 150 or within an internal layer of circuit board 150. Further, each pad may be operable to receive a pin of an electronic component (e.g., a packaged integrated circuit) and provide electrical connectivity between the pin and one or more traces. Further, some pads may be operable to receive a conductor of a differential cable 170, as described in greater detail below. Traces may comprise a conductive material and may be formed on a surface of circuit board 150, or in a layer of circuit board 150 not visible from the surface thereof. Further, each trace may be operable to provide conductive pathways between electronic components mounted or otherwise electrically coupled to pads. Connectivity between pads and/or traces disposed on and/or in various layers of circuit board 150 may be provided by vias.

As shown in FIG. 5, first signal conductor 176 and second signal conductor 180 may be exposed at an end of differential cable 170 and first signal conductor 176 and second signal conductor 180 may be respectively contacted to pads 156 and 160 formed on a surface of a surface dielectric layer 154 of circuit board 150.

As also shown in FIG. 5, portions of surface dielectric layer 154 may be removed (or otherwise absent), creating openings exposing a ground plane 152 of circuit board 150 through surface dielectric layer 154, and first drain conductor 174 and second drain conductor 184 may be contacted to ground plane 152 through such openings.

FIG. 6 illustrates a cross-sectional elevation view of a method for mechanically contacting conductors of differential cable 170 to circuit board 150, in accordance with embodiments of the present disclosure. In operation, a conductive adhesive material (e.g., a small ball of glue, a ball of solder, a solder paste, etc.) in a solid form may be placed on each of pads 156 and 160, and first signal conductor 176 and second signal conductor 180 may be placed in contact with the respective instances of adhesive material. Further, adhesive material in a solid form may also be placed at particular locations on exposed portions of ground plane 152 and first drain conductor 174 and second drain conductor 184 may be placed in contact with respective instances of adhesive material. Then, a hotbar 140, which may comprise a metal or other thermally-conductive material, and which may be heated to a temperature above the melting point of the adhesive material, may apply mechanical pressure between first signal conductor 176 and second signal conductor 180 and pads 156 and 160, respectively, and apply mechanical pressure between ground plane 152 and each of first drain conductor 174 and second drain conductor 184, thus melting the adhesive material and causing mechanical contact between first signal conductor 176 and second signal conductor 180 and pads 156 and 160, respectively, and causing mechanical contact between ground plane 152 and each of first drain conductor 174 and second drain conductor 184. Accordingly, hotbar 140 may have a profile capable of providing such mechanical pressure.

Hotbar 140 may then be removed, allowing the adhesive material to cool and return to solid form, and mechanically retaining first signal conductor 176 and second signal conductor 180 to pads 156 and 160, respectively, and mechanically retaining first drain conductor 174 and second drain conductor 184 to ground plane 152.

Although FIGS. 5 and 6 depict only certain conductive layers and dielectric insulating layers in circuit board 150 for the purposes of clarity and exposition, it is understood that circuit board 150 may include more conductive layers and more dielectric insulating layers than depicted in FIGS. 5 and 6.

Using the systems and methods disclosed herein, the disadvantages described in the background section may be reduced or eliminated. For example, capacitances between first signal conductor 176 and first drain conductor 174 and between second signal conductor 180 and second drain conductor 184 may be reduced as compared to capacitances between first signal conductor 76 and first drain conductor 74 and between second signal conductor 80 and second drain conductor 84 as is the case using traditional approaches. Such capacitances may also be reduced due to the fact that dielectric material present in a circuit board using traditional approaches may be replaced by air using the approaches described herein. Such capacitances may additionally be reduced as first signal conductor 176 and first drain conductor 174 may not be parallel near the point of coupling to circuit board 150 and second signal conductor 180 and second drain conductor 184 may not be parallel near the point of coupling to circuit board 150. Further, such capacitances may additionally be reduced as first drain conductor 174 and second drain conductor 184 may be directly coupled to ground plane 152 without vias.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system, comprising:
   a circuit board comprising:
      a plurality of electrically-conductive layers separated and supported by layers of insulating material laminated together, wherein:
         the plurality of electrically-conductive layers comprises a ground plane; and
         the layers of insulating material comprise a surface layer having one or more openings through which the ground plane is exposed through the one or more openings; and
      a plurality of electrically-conductive pads formed on a surface of the surface layer; and
   a cable comprising:
      a first signal conductor directly mechanically contacted to a first pad of the plurality of electrically-conductive pads; and
      a first drain conductor directly mechanically contacted to the ground plane through the one or more openings.

2. The system of claim 1, wherein:
   the first signal conductor is adhesively contacted to the first pad; and
   the first drain conductor is adhesively contacted to the ground plane.

3. The system of claim 1, wherein the cable further comprises:
   a second signal conductor mechanically contacted to a second pad of the plurality of electrically-conductive pads; and
   a second drain conductor mechanically contacted to the ground plane through the one or more openings.

4. A method, comprising:
   directly mechanically contacting a first signal conductor of a cable to a first pad of a plurality of electrically-conductive pads formed on a surface of a surface layer of a circuit board comprising a plurality of electrically-conductive layers separated and supported by layers of insulating material laminated together, wherein the plurality of electrically-conductive layers comprises a ground plane and the layers of insulating material comprise a surface layer; and
   directly mechanically contacting a first drain conductor of the cable to the ground plane through one or more openings formed in the surface layer through which the ground plane is exposed through the one or more openings.

5. The method of claim 4, wherein:
   mechanically contacting the first signal conductor to the first pad comprises adhesively contacting the first signal conductor to the first pad; and
   mechanically contacting the first drain conductor to the ground plane comprises adhesively contacting the first drain conductor to the ground plane.

6. The method of claim 5, wherein mechanically contacting the first signal conductor to the first pad and mechanically contacting the first drain conductor to the ground plane comprises:
   applying heat to adhesive material disposed on the first pad and the ground plane; and
   applying mechanical pressure between the first signal conductor to the first pad and between the first drain conductor to the ground plane.

7. The method of claim 4, further comprising:
   mechanically contacting a second signal conductor of the cable to a second pad of the plurality of electrically-conductive pads; and
   mechanically contacting a second drain conductor of the cable to the ground plane through the one or more openings.

* * * * *